United States Patent [19]

In Den Kleef et al.

[11] Patent Number: 4,754,223

[45] Date of Patent: Jun. 28, 1988

[54] METHOD FOR THE PHASE CORRECTION OF MR INVERSION RECOVERY IMAGES

[75] Inventors: Josephus J. E. In Den Kleef; Johannes P. Groen, both of Eindhoven, Netherlands

[73] Assignee: U.S. Philips Corporation, New York, N.Y.

[21] Appl. No.: 921,929

[22] Filed: Oct. 20, 1986

[30] Foreign Application Priority Data

Oct. 22, 1985 [NL] Netherlands .................. 8502871

[51] Int. Cl.$^4$ ............................................. G01R 33/20
[52] U.S. Cl. ...................................... 324/309; 324/312
[58] Field of Search .......................... 324/307, 309, 312

[56] References Cited

U.S. PATENT DOCUMENTS 4,620,154 10/1986 Inouye .................................. 324/312
4,625,170 11/1986 Yamamoto et al. ................. 324/309
4,649,346 3/1987 Yeung et al. ......................... 324/312

FOREIGN PATENT DOCUMENTS 0145276 6/1985 European Pat. Off. .

OTHER PUBLICATIONS

Locher, P. R., "Proton NMR Tomography", Philips Technical Review, vol. 41, 1983/84, No. 3.

Primary Examiner—Stewart J. Levy
Assistant Examiner—Kevin D. O'Shea
Attorney, Agent, or Firm—Thomas A. Briody; Algy Tamoshunas; William J. Streeter

[57] ABSTRACT

During known MRI measurements, for example spin echo and inversion recovery measurements, phase errors occur in pixels, inter alia due to eddy currents caused by the application or interruption of magnetic field gradients during a measurement. There is proposed an inversion recovery method combined with a method where the magnetization is not inverted in advance in order to determine for each pixel the phase error in an image obtained by means of an inversion recovery method, so that inversion recovery images can be obtained which do not contain phase errors.

10 Claims, 1 Drawing Sheet

– 4,754,223 –

METHOD FOR THE PHASE CORRECTION OF MR INVERSION RECOVERY IMAGES

BACKGROUND OF THE INVENTION

The invention relates to a method of determining a nuclear magnetization distribution in a region of a body which is situated in a steady, uniform magnetic field. In the method, spin resonance signals are generated in the region of the body in first and second sequences by high-frequency excitation pulses and are measured in the presence of magnetic field gradients superposed on the uniform magnetic field. The excitation pulse in one sequence is preceded by a high-frequency inversion pulse which inverts the nuclear magnetization. Using a transformation, a first image of complex image values is formed from said first sequence and a second image of complex image values is formed from said second sequence, each pixel in the first image and the second image being represented by an image amplitude and an image phase.

The invention also relates to a device for determining a nuclear magnetization distribution in a region of a body, including:
means for generating a steady, uniform magnetic field,
means for generating high-frequency excitation pulses,
means for generating magnetic field gradients which are superposed on the uniform magnetic field,
means for measuring spin resonance signals, processing means for processing the measured spin resonance signals,
control means for controlling the above means,
said control means being suitable for the measurement of different sequences,
said processing means being suitable for combining measurement results from two different sequences and for determining images from the sequences.

Such a method and device are known from EP No. 0.145.276.

Devices for determining a nuclear magnetization distribution in a region of a body and the principles on which the operation of such devices is based are known, for example from the article "Proton NMR tomography" in Philips Technical Review, Volume 41, 1983/84, No. 3, pages 73–88. Reference is made to this article for the description of their construction and principles.

In a method described in EP No. 0.145.276, a body to be examined is exposed to a steady, uniform magnetic field Bo during a so-called saturation recovery measurement wherein a selective 90° excitation pulse is followed by a non-selective 180° pulse in order to obtain an echo signal. The steady, uniform magnetic field Bo has a direction which coincides with, for example the z-axis of a cartesian coordinate system (x,y,z). The steady magnetic field Bo causes a slight polarization of the spins present in the body and enables spins to perform a precessional motion about the direction of the magnetic field Bo. After the establishment of the magnetic field Bo, a magnetic field gradient which acts as a selection gradient is applied and at the same time a 90° rf pulse is generated which rotates the magnetization of the nuclei present in a selected slice through an angle of 90°. After termination of the 90° pulse, the spins will perform a precessional motion about the field direction of the magnetic field Bo, thus generating a resonance signal (FID signal). After the 90° pulse, there are simultaneously applied field gradients $G_z$, $G_x$ and $G_y$ whose field direction coincides with that of the magnetic field Bo and whose gradient directions extend in the z, the x, and the y direction, respectively. The field gradient $G_z$ then opposes the $G_z$ applied during the 90° pulse and serves for rephasing the excited spins in a slice perpendicular to the z direction. The field gradients $G_x$ and $G_y$ serve for encoding in the x direction and the y direction, respectively. After termination of the three noted field gradients and after application of a 180° echo pulse, a field gradient $G_x$ is applied and an echo resonance signal of the original FID signal is sampled, after which an image is reconstructed after Fourier transformation. In the cited European Specification EO No. 0.145.276 it is noted that the phase of the pixels generated by means of this so-called saturation recovery measurement can be disturbed by inter alia eddy currents which arise in conductive parts of an MRI apparatus due to the application or termination of magnetic field gradients during a measurement. In order to eliminate, or at least mitigate, phase disturbances in pixels generated by means of a saturation recovery measurement, the cited Patent Specification EP No. 0.145.276 proposes an extension of the method in the form of an inversion recovery measurement, including a non-selective 180° pulse in order to obtain an echo signal. The pulse sequence thereof has the same appearance as that of a saturation recovery measurement, be it that for an inversion recovery measurement the pulse sequence is increased to include a high-frequency electromagnetic 180° pulse which is generated some time before the high-frequency electromagnetic 90° pulse. It will be apparent that the time sequence in which the saturation recovery measurement and an inversion recovery measurement are performed is irrelevant. By determining the quotient per pixel of the images obtained from an inversion recovery measurement and a saturation recovery measurement, respectively, ideally an image without phase errors will be obtained, provided that the two types of measurement have both been performed under the same experimental conditions so that the phase errors cancel one another.

A drawback of the known, extended method is that the quotient of the cited Patent Specification EP No. 0.145.276 contains an imaginary term which represents the difference between the phase errors in the two sequences and which is not always negligibly small in practice, so that corrected pixels will still contain phase errors which give rise to annoying differences in intensity in a corrected image. A further drawback is that the inversion recovery measurement does not produce a pure inversion recovery image, but rather, in conjunction with the saturation recovery measurement, a proportional image.

SUMMARY OF THE INVENTION

It is the object of the invention to provide a method for the determination of pixels of an inversion recovery image which do not contain phase errors, so that an image is obtained which does not contain annoying intensity differences.

To this end, a method in accordance with the invention is characterized in that for each corresponding pixel the value of a sign function is determined from the phase difference between the pixels of the first image and the pixels of the second image. If only the complex image values of the first image were used to form an amplitude image by taking the modulus of each complex image value, the sign information of the first image would be lost. When each image value in the amplitude image is multiplied by the sign function whose value depends on said phase difference, and when a suitable sign function is chosen, the sign function of the first image will not be lost.

One version of a method in accordance with the invention is characterized in that the sign function has the value one if: $\pi/2 <$ the phase difference $< \pi/2$, and otherwise has the value minus one. When the phase errors are of the same order of magnitude, this sign function which discriminates equally as regards a positive or a negative sign, will be a suitable choice. A different variation of the sign function could be considered when the phase errors deviate substantially. It is to be noted that phase errors may be due not only to systematic causes, such as for example eddy currents, but also to non-systematic causes, for example spins which are subject to flow.

A further version of a method in accordance with the invention where the variation of the magnetic field gradients is identical in the two sequences for each pair of resonance signals, is characterized in that in the second sequence, a dummy gradient is applied at the location which corresponds to that at which the high-frequency inversion pulse occurs in the first sequence. This dummy gradient, not having a function per se, merely serves to make the gradient identical in the sequence. This dummy gradient and all other gradients in the second sequence should have the same amplitude and duration and should be switched at instants which correspond to those in the first sequence. The result is that the phase errors of systematic origin will be at least substantially equal.

A further version of a method in accordance with the invention is characterized in that the second sequence is generated with a different resolution and that by interpolation and transformation an image is obtained therefrom having the same resolution as an image from the first sequence. By generating the second sequence with a different, preferably lower resolution, the total experimentation time is substantially reduced, which is favourable both as regards the rf dose for, for example a patient to be examined, as well as regards rf load for a high-frequency pulse transmitter. A comparatively short experimentation time also reduces the risk of image artifacts due to motions of, for example, the patient to be examined.

A further version of a method in accordance with the invention, where a third image is formed from the first and the second complex image, is characterized in that each pixel of the third image is derived from the product of the image amplitude of the corresponding pixel of the first image and the associated value of the sign function. An image thus obtained represents complex image values of the first image wherefrom phase errors have been removed as well as possible, even in the case of substantial phase errors.

A further version of a method in accordance with the invention, where for each pixel there is determined a ratio which depends on the longitudinal relaxation time $T_1$, is characterized in that the ratio is the quotient of the image amplitude of the corresponding pixels of the first and the second image, multiplied by the value of the sign function for these pixels.

Inter alia from EP No. 0.140.276 it is known that the local longitudinal relaxation time $T_1$ can be calculated from the quotient per pixel of the images obtained from an inversion recovery measurement and a saturation recovery measurement, respectively. As has already been explained, this quotient will contain an imaginary term which cannot be ignored in practice. Due to phase errors, this will lead to incorrect determination of the local relaxation time $T_1$. The said ratio offers a better basis for the determination of $T_1$ per pixel, and hence for the formation of a $T_1$ image.

A device in accordance with the invention is characterized in that for corresponding pixels the processing means determine the value of a sign function from the phase difference between the pixels of the first and the second image.

BRIEF DESCRIPTION OF THE DRAWING

The invention will be described in detail hereinafter with reference to the drawing wherein.

DESCRIPTION OF THE PREFERRED EMBODIMENTS

The image intensity per pixel of an image obtained by means of NMR techniques generally depends on the proton density $\rho$ locally present in an excited layer, on the longitudinal relaxation time $T_1$ and on the transverse relaxation time $T_2$. These are important parameters which influence the nuclear magnetization distribution in the layer. Inversion recovery measurements are suitable for obtaining images whose intensity depends mainly on the density $\rho$ locally present in the excited layer and on the relaxation time $T_1$. Spin-echo measurements are usually performed for obtaining an image intensity which depends mainly on the density $\rho$ and the relaxation time $T_2$. In practice, inversion recovery measurements and spin-echo measurements are performed during one experiment in order to determine the nuclear magnetization distribution by means of images from an excited layer which are mainly $\rho$, $T_1$ or $\rho$, $T_2$ dependent.

One problem of NMR measurements in general is the occurrence of eddy currents. These eddy currents themselves cause magnetic field gradients which introduce phase errors in an image to be obtained from a measurement. This is because a given number of nuclei which have the same precessional phase and the same precessional frequency will make a given signal contribution to the ultimate signal. Because the magnetic field gradients caused by eddy currents will also influence the precessional phase and the precessional frequency of that given number of nuclei, the number of nuclei generating a given signal contribution will change. As a result, the intensity of that signal contribution will also change.

Figure 1:
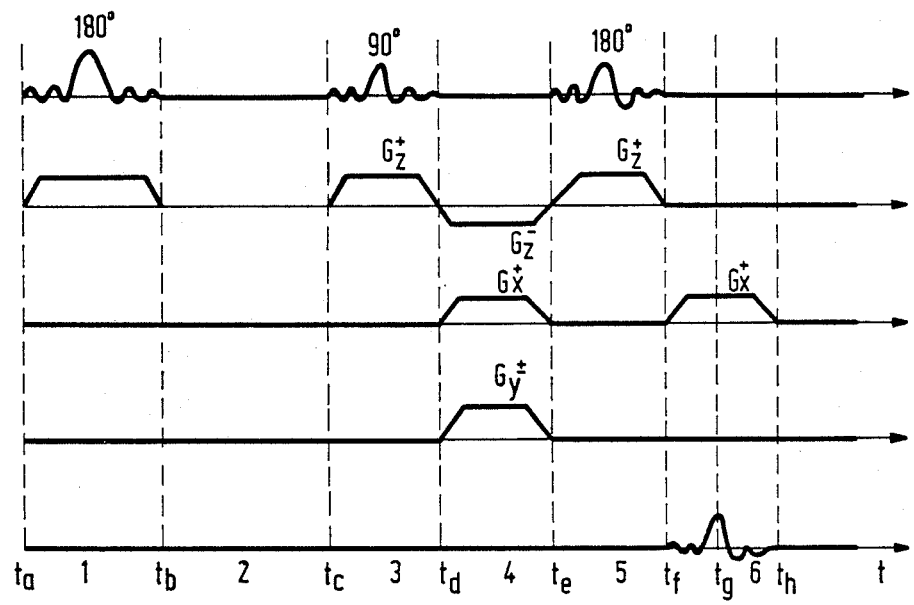
FIG. 1 shows normal pulse sequences of an inversion recovery measurement with spin-echo reading.

FIG. 1 shows a normal inversion recovery pulse sequence with spin-echo reading. A clockwise rotating orthonormal coordinate system will be considered in which a static, uniform magnetic field is directed along the z-axis, a high-frequency electromagnetic field is directed perpendicularly to the direction of the uniform magnetic field, and the field directions of gradient fields coincide with the field direction of the uniform field, while the gradient directions extend perpendicularly with respect to one another. During an interval 1, bounded by the instants $t=t_a$ and $t=t_b$, a magnetic field gradient $G_z^+$ is applied and at the same time a high-frequency electromagnetic 180° pulse is generated. As a result, the spins will be excited in a plane $Z=Z_o$, which means that the magnetization generated by the spins in the plane $Z=Z_o$ encloses an angle of 180° with respect to the positive z-axis, i.e. is directed along the negative z-axis. Because the 180° pulse has a given bandwidth, spins will be excited not only in the plane $Z=Z_o$, but also in the immediate vicinity thereof. By variation of the frequency content of the 180° pulse, spins in another plane, parallel to the plane $Z=Z_o$, can be excited. After the instant $t=t_b$, the spins will reorient in the direction of the static, uniform magnetic field, because as from that instant, they will no longer be subject to a high-frequency electromagnetic pulse. This relaxation process continues until the magnetization is directed in the original positive z-direction again. The magnetization will then successively decrease along the negative z-axis, become zero and increase along the positive z-axis until the original value is reached again, as has already been stated. During an interval 3, bounded by the instants $t=t_c$ and $t=t_d$, a high-frequency electromagnetic 90° pulse is generated in the presence of the magnetic field gradient $G_z^+$ in order to cause a precessional motion of the magnetization in the excited layer at an angle of 90° about the z-axis. During an interval 4, bounded by the instants $t=t_d$ and $t=t_e$, three magnetic field gradients $G_z^-$, $G_x^+$ and $G_y^\pm$ are applied. In order to save time, these three field gradients are applied during the same time interval. However, because no high-frequency electromagnetic pulses are generated during that interval, the effects of the field gradients can be separately considered. The negative gradient $G_z^-$ rephases the spins in the z-direction so that the spins which have been selectively excited in and in the immediate vicinity of the plane $Z=Z_o$ are no longer subject to phase discrimination in the z-direction. The magnetic field gradients $G_x^+$ and $G_y^\pm$ serve for deliberate dephasing of the spins in the x-direction and the y-direction, respectively. Encoding is thus realized in both directions. Between the instants $t=t_f$ and $t=t_h$ there is generated a resonance signal which depends on the magnetization locally present in the z-direction immediately before the instant $t=t_c$. The magnitude of this magnetization depends on the longitudinal relaxation time $T_1$. When an excited layer of, for example a patient, contains different types of tissues having different $T_1$ times, the local magnetizations may be either in phase or 180° out of phase. This is because, when the duration $T=(t_b\cdot t_c)$ is smaller than $T_1\cdot\ln 2$, so that a local magnetization is still directed along the negative z-axis prior to the influencing of the magnetization by a high-frequency electromagnetic 90° pulse, the ultimate magnetization will be 180° out of phase with respect to the local magnetization generated by nuclei in, for example a tissue for which the duration T exceeds $T_1\cdot\ln 2$. The local magnetization will then be directed along the positive z-axis at the instant $t=t_c$. The previously mentioned magnetic field gradients caused by eddy currents can disturb the phase or frequency components in resonance signals during inversion recovery measurements.

Figure 2:
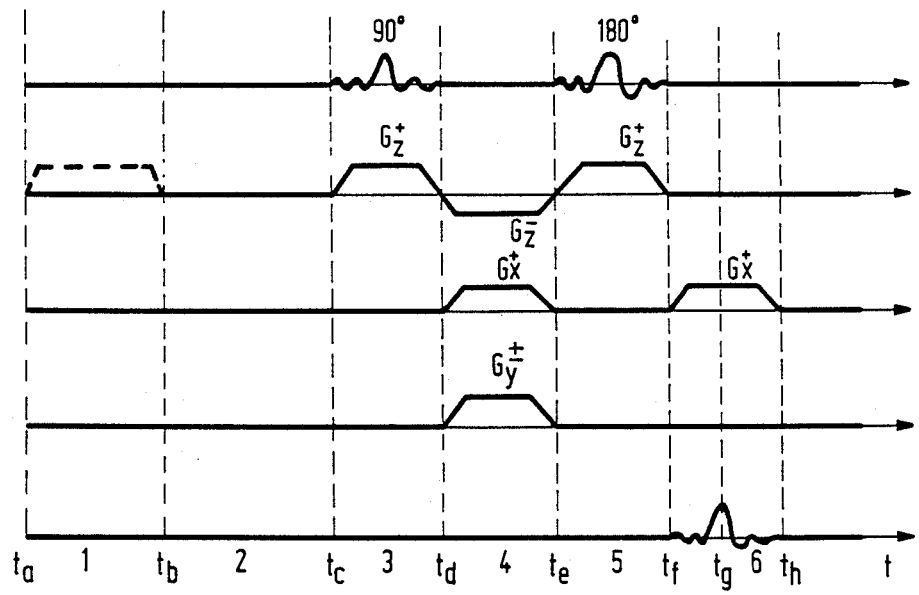
FIG. 2 shows a pulse sequence of a spin-echo measurement.

FIG. 2 shows a spin-echo pulse sequence. During interval 1 there is applied a dummy gradient $G_z^+$ in order to obtain the same $G_z$ gradient variation as during the inversion recovery sequence, so that at least substantially equal eddy currents will arise. Therefore, the phase errors caused by eddy curents will be at least substantially equal in both sequences. The high-frequency electromagnetic 90° pulse generated during the interval 3, bounded by $t=t_c$ and $t=t_d$, rotates the magnetization formed by the spins locally present in the layer through an angle of 90° with respect to the z-axis. The high-frequency electromagnetic 180° pulse generated during the interval 5, bounded by the instants $t=t_e$ and $t=t_f$, creates an echo resonance signal during the interval $(t_f, t_h)$. The functions of the magnetic field gradients $G_z^+$, $G_z^-$, $G_x^+$ and $G_y^\pm$ are the same as stated in the description of the inversion recovery pulse sequence of FIG. 1. Even though, for example, different types of tissue having different $T_1$ relaxation times may again be present in an excited layer, the local magnetizations ultimately obtained will ideally be in phase. This so because magnetizations which are directed along the negative z-axis will not occur during a measurement. Due to the above noted eddy currents, disturbances will also occur in an image obtained during spin-echo measurements. As will be demonstrated hereinafter, the phase errors in an inversion recovery image which could result in pixels having an incorrect intensity can be reduced by combining an inversion recovery measurement and a spin-echo measurement. After double phase-sensitive detection of the resonance signals of the inversion recovery measurement, the two groups of signals derived therefrom are sampled after filtering, after which a complex image is reconstructed from the two groups of sampling values by way of 2D Fourier transformation. This operation is also performed on the resonance signals of the spin-echo measurement.

The value of an inversion recovery (IR) pixel and of a spin-echo (SE) pixel can be expressed in a complex notation:

$$S_{IR} = \text{mod } (S_{IR})e^{i\phi S} \tag{1}$$

$$S_{SE} = \text{mos } (S_{SE})e^{i\phi S} \tag{2}$$

wherein $S_{IR}$ is the value of a complex IR pixel, mod $(S_{IR})$ is the modulus, and $\phi_{SIR}$ is the phase of the complex IR pixel. A corresponding notation is used for the spin-echo resonance pixel. Ideally, that is to say without the phase errors caused by eddy currents and without other phase errors, for example as caused by inhomogeneities of the static, uniform magnetic field and by imperfect high-frequency electromagnetic 90° pulses or 180° pulses, the following would hold good:

$$\phi_{SIR} = 0 \text{ or } \phi_{SIR} = \pi, \tag{3}$$

$$\text{so that } S = \begin{cases} \text{mod}(S_{IR}) \text{ for } \phi_{SIR} = 0 \\ -\text{mod}(S_{IR}) \text{ for } \phi_{SIR} = \pi \end{cases}$$

$$\phi_{SSE}=0 \text{ so that } S_{SE}=\text{mod }(S_{SE}) \text{ for } \phi_{SSE}=0 \tag{4}$$

When the phase errors caused by eddy currents and the other phase errors are taken into account in a term $\Delta\phi$, the expressions (1) and (2) will be:

$$S_{IR} = \text{mod } (S_{IR})e^{i(\phi S + \Delta\phi S)} \tag{5}$$

$$S_{SE} = \text{mod } (S_{SE})e^{i(\phi S + \Delta\phi S)} \tag{6}$$

The term $\Delta\phi_{SSE}$ can now be simply determined for each pixel according to:

$$\Delta\phi_{SSE} = \arctan \frac{\text{Im } S_{SE}}{\text{Re } S_{SE}} \tag{7}$$

wherein $\text{Re} S_{SE}$ and $\text{Im} S_{SE}$ are the real and the imaginary part, respectively, of the complex pixel (2). Assuming that the phase errors of the complex pixels $S_{SE}$ and $S_{IR}$ exhibit the same behaviour, so $$\Delta\phi_{SSE} \approx \Delta\phi_{SIR} \quad (8)$$

the phase errors in inversion recovery pixels can be reduced. This condition can indeed be substantially satisfied by choosing the experimental situation to be such that the spins during an inversion recovery measurement or, for example during a spin-echo measurement, are subject to the same effect on the phase error by the gradients. The measurements as shown in the FIGS. 1 and 2 are relevant examples. The modulus image of the IR pixel in accordance with equation (1) is the same as the modulus image of the IR pixel in accordance with equation (5). For correction it will merely be necessary to determine the + or − sign of the modulus in accordance with equation (3). It has been found that the modulus can be suitably estimated to obtain a + sign if $$-\pi/2 < \phi_{SIR} + \Delta\phi_{SIR} - \Delta\phi_{SSE} < \pi/2$$

and that it obtains a − sign if $$\pi/2 < \phi_{SIR} + \Delta\phi_{SIR} - \Delta\phi_{SSE} < 3\pi/2 \quad (9)$$

where, $\phi_{SIR} + \Delta\phi_{SIR}$ is the measured phase per pixel of the IR measurement and $\Delta\phi_{SSE}$ is the measured phase per pixel of the SE measurement. Other estimation intervals may also be chosen. In addition to providing the modulus with a + or − sign, for example the modulus may also be reduced in the vicinity of the boundaries of the estimation intervals, which implies that the sign function will have an absolute value smaller than one in the vicinity of the boundaries of the estimation intervals. Another possibility is to use more advanced statistical methods for determining the + or − sign in the vicinity of the boundaries.

The invention can also be used for determining the longitudinal relaxation time $T_1$ per pixel. From Journal of Magn. Res. in Med. 2, 136–158 (1985) it is known to derive the relaxation time $T_1$ from the ratio of the real portions $\text{Re}(S_{IR})$ and $\text{Re}(S_{SE})$ of the pixels $S_{IR}$ and $S_{SE}$, respectively:

$$R = \frac{\text{Re } S_{IR}}{\text{Re } S_{SE}} = \frac{\text{mod}(S_{IR}) \cos(\phi_{SIR} + \Delta\phi_{SIR})}{\text{mod}(S_{SE}) \cos(\Delta\phi_{SSE})} \quad (10)$$

As appears from equation (10), this determination of the relaxation time $T_1$ is also subject to phase errors. The $T_1$ relaxation time can be determined without phase errors when in accordance with the invention the time $T_1$ is derived by means of:

$$R = \frac{\text{sign function} \cdot \text{mod}(S_{IR})}{\text{mod}(S_{SE})} \quad (11)$$

wherein the sign function generates a + sign or a − sign, respectively, in accordance with the criterion of equation (9) or another criterion. The longitudinal relaxation time $T_1$ per pixel can subsequently be determined by using a value R obtained by means of the equation (11) for looking up an associated relaxation time $T_1$ in computer look-up tables in which the theoretical ratio R is stated together with the associated time $T_1$. Using the R obtained from equation (11), $T_1$ can also be solved from the theoretical ratio R by means of numerical zero-point determination methods.

The theoretical dependency of $T_1$ on the ratio R can be found by solution of Bloch's equations. It is to be noted that after the interval 2 in both sequences any other method can be used in order to derive the resonance signals or to generate echo signals, including manipulation of gradients such that image reconstruction is also possible using, for example a projection reconstruction method.

What is claimed is:

1. In a method of determining a nuclear magnetization distribution in a region of a body which is situated in a steady, uniform magnetic field, generating spin resonance signals in the region of the body in first and second sequences by high-frequency excitation pulses, measuring said signals in the presence of magnetic field gradients superposed on the uniform magnetic field, the excitation pulse in one sequence being preceded by a high-frequency inversion pulse which inverts the nuclear magnetization, using a transformation to form a first image of complex image values from the first sequence and a second image of complex image values from the second sequence, said images representing nuclear magnetization distributions, the improvement comprising the step of determining the value of a sign function for each corresponding complex image value of the first image and the second image, each corresponding value of the sign function being determined from the phase difference between the corresponding complex image values of the first image and the second image.

2. The method as claimed in claim 1, wherein the sign function has the value one if $-\pi/2<$ the phase difference $<\pi/2$, and otherwise has the value minus one.

3. The method as claimed in claim 1 or 2, wherein the variation of the magnetic field gradients is identical in the two sequences for each corresponding pair of resonance signals, and further comprising the step of applying a dummy gradient in the second sequence at the location which corresponds to that at which the high-frequency inversion pulse occurs in the first sequence.

4. The method as claimed in claim 1 wherein the second sequence is generated with a different resolution from the first sequence and by interpolation and transformation an image is obtained therefrom having the same resolution as an image from the first sequence.

5. A method as claimed in claim 1, where a third image is formed from the first and the second complex image, wherein each pixel of the third image is derived from the product of the image amplitude of the corresponding pixel of the first image and the associated value of the sign function.

6. A method as claimed in claim 1, where for each pixel there is determined a ratio which depends on the longitudinal relaxation time $T_1$, characterized in that the ratio is the quotient of the image amplitude of the corresponding pixels of the first and the second image, multiplied by the value of the sign function for these pixels.

7. In a method for determining a nuclear magnetic distribution in a region of a body wherein spin resonance signals are generated in the region of the body in first and second sequences and wherein transformations are used to form a first image of complex image values from the first sequence of spin resonance signals and a second image of complex image values from the second sequence of spin resonance signals, the improvement comprising determining the value of a sign function for each corresponding complex image value of the first image and the second image, each corresponding value of the sign function being determined from the phase difference between the corresponding complex image values of the first image and the second image.

8. The method according to claim 7 further comprising forming a third image of pixels from the first image of complex image values and the sign function wherein each corresponding pixel of the third image has a value that is derived from the product of the image amplitude of the corresponding complex image value of the first image and the corresponding value of the sign function.

9. The method according to claim 8 further comprising forming a third image of pixels from the first and second images of complex values and the sign function wherein each corresponding pixel of the third image has a value that is derived by forming the quotient of the amplitude of each corresponding complex image value of the first image and the second image and multiplying each quotient by the corresponding value of the sign function.

10. The method of any one of claims 7-9 wherein the sign function has the value one if the phase difference has a value greater than $-\pi/2$ and less than $\pi/2$, and otherwise has the value minus one.

* * * * *